US010075129B2

(12) United States Patent
Lee

(10) Patent No.: US 10,075,129 B2
(45) Date of Patent: Sep. 11, 2018

(54) APPARATUS FOR MONITORING LEAKAGE CURRENT OF TRANSFORMER-LESS PHOTOVOLTAIC INVERTER

(71) Applicant: LSIS CO., LTD., Anyang-si, Gyeonggi-do (KR)

(72) Inventor: Il Yong Lee, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 296 days.

(21) Appl. No.: 14/685,381

(22) Filed: Apr. 13, 2015

(65) Prior Publication Data
US 2015/0311862 A1 Oct. 29, 2015

(30) Foreign Application Priority Data

Apr. 28, 2014 (KR) .................. 10-2014-0050554

(51) Int. Cl.
*G01R 31/02* (2006.01)
*G01R 31/00* (2006.01)
(Continued)

(52) U.S. Cl.
CPC ............ *H02S 50/00* (2013.01); *G01R 31/025* (2013.01); *H02H 3/33* (2013.01); *G01R 19/2513* (2013.01);
(Continued)

(58) Field of Classification Search
CPC ........ H02S 50/00; G01R 31/025; G01R 31/42
(Continued)

(56) References Cited

U.S. PATENT DOCUMENTS 4,422,034 A * 12/1983 Matsuno .............. G01R 27/025
324/541
4,638,242 A * 1/1987 Matsuno .............. G01R 27/025
324/551
(Continued)

FOREIGN PATENT DOCUMENTS

CN 1243987 3/2006
EP 1855122 11/2007
(Continued)

OTHER PUBLICATIONS

Japan Patent Office Application Serial No. 2015-090356, Office Action dated Jan. 26, 2016, 2 pages.
(Continued)

*Primary Examiner* — Ly D Pham
(74) *Attorney, Agent, or Firm* — K&L Gates LLP

(57) ABSTRACT

Disclosed is an apparatus for monitoring a leakage current of a transformer-less photovoltaic inverter, which can reduce the risk of a fault in a grid due to a leakage current in a photovoltaic inverter. The apparatus comprises a low pass filter configured to remove a high-frequency noise of a sensed leakage current signal; an average value calculator configured to calculate an average value of an output of the low pass filter; a direct current component remover configured to subtract the average value from the output of the low pass filter; a phase locked loop circuit section configured to calculate a peak value and a phase of a signal from which the direct current component has been removed; and a resistive component leakage current calculator configured to calculate a resistive component value of a leakage current, based on the peak value and the phase calculated.

5 Claims, 4 Drawing Sheets

(51) Int. Cl.
  G01R 19/00  (2006.01)
  H02S 50/00  (2014.01)
  H02H 3/33  (2006.01)
  G01R 19/25  (2006.01)
  G01R 31/42  (2006.01)
  H02H 7/20  (2006.01)
(52) U.S. Cl.
  CPC .............. G01R 31/02 (2013.01); G01R 31/42 (2013.01); H02H 7/20 (2013.01)
(58) Field of Classification Search
  USPC .......................................................... 702/58
  See application file for complete search history.

(56) References Cited

U.S. PATENT DOCUMENTS

| | | | | | |
|---|---|---|---|---|---|
| 5,223,789 | A | * | 6/1993 | Katsuyama | G01R 19/15 324/117 R |
| 5,856,902 | A | * | 1/1999 | Hashimoto | H02H 3/33 361/42 |
| 6,134,126 | A | * | 10/2000 | Ikekame | H02J 3/01 307/105 |
| 6,392,422 | B1 | * | 5/2002 | Kammer | H02H 1/06 324/509 |
| 7,423,697 | B1 | * | 9/2008 | Gudmundson | H04N 5/18 348/691 |
| 8,473,250 | B2 | * | 6/2013 | Adest | G01D 4/004 307/56 |
| 2001/0036048 | A1 | * | 11/2001 | Goto | H02H 3/33 361/42 |
| 2003/0067724 | A1 | * | 4/2003 | Takehara | H02H 3/337 361/42 |
| 2003/0112015 | A1 | | 6/2003 | Takakamo et al. | |
| 2004/0017224 | A1 | * | 1/2004 | Tumer | H03F 3/087 327/51 |
| 2005/0030005 | A1 | * | 2/2005 | Tsubota | G01R 19/20 324/127 |
| 2008/0165462 | A1 | * | 7/2008 | Atoji | H02H 3/337 361/87 |
| 2009/0287430 | A1 | * | 11/2009 | Atoji | G01R 31/025 702/58 |
| 2009/0289618 | A1 | * | 11/2009 | Tajima | G01R 19/175 324/127 |
| 2009/0322358 | A1 | * | 12/2009 | Imaizumi | G01R 27/02 324/713 |
| 2010/0033140 | A1 | * | 2/2010 | Otake | B60L 3/04 320/165 |
| 2010/0131215 | A1 | | 5/2010 | Kim | |
| 2010/0194354 | A1 | * | 8/2010 | Gotou | H02H 3/33 320/163 |
| 2010/0213905 | A1 | * | 8/2010 | Doumae | G01R 31/025 320/166 |
| 2011/0110003 | A1 | * | 5/2011 | Goto | H02H 3/33 361/42 |
| 2011/0148431 | A1 | * | 6/2011 | Satou | G01R 31/027 324/547 |
| 2011/0260796 | A1 | * | 10/2011 | Tanaka | G05F 3/262 330/288 |
| 2011/0320146 | A1 | * | 12/2011 | Watanabe | G01R 31/1227 702/65 |
| 2012/0014020 | A1 | * | 1/2012 | Lehmann | G01R 31/025 361/42 |
| 2013/0127261 | A1 | * | 5/2013 | Kagawa | H01R 13/707 307/125 |
| 2013/0147419 | A1 | * | 6/2013 | Sakai | H02M 1/12 318/722 |
| 2013/0200711 | A1 | * | 8/2013 | Davies | H02J 3/385 307/77 |
| 2015/0137850 | A1 | * | 5/2015 | Falk | G01R 31/025 324/764.01 |

FOREIGN PATENT DOCUMENTS

| | | |
|---|---|---|
| EP | 1898225 | 3/2008 |
| JP | 2002-140123 | 5/2002 |
| JP | 2004-012147 | 1/2004 |
| JP | 2014-39444 | 2/2014 |

OTHER PUBLICATIONS

Buticchi, et al., "A DC Offset Current Compensation Strategy in Transformerless Grid-Connected Power Converters," IEEE Transactions on Power Delivery, vol. 26, No. 4, XP011385580, Oct. 2011, pp. 2743-2751.
European Patent Office Application Serial No. 15164570.2, Search Report dated Oct. 26, 2015, 7 pages.
State Intellectual Property Office of the People's Republic of China Serial No. 201510209562.1, Office Action dated May 11, 2017, 7 pages.

* cited by examiner

APPARATUS FOR MONITORING LEAKAGE CURRENT OF TRANSFORMER-LESS PHOTOVOLTAIC INVERTER

CROSS-REFERENCE TO RELATED APPLICATION

Pursuant to 35 U.S.C. § 119(a), this application claims the benefit of earlier filing date and right of priority to Korean Application No. 10-2014-0050554, filed on Apr. 28, 2014, the contents of which are all hereby incorporated by reference herein in its entirety.

BACKGROUND OF THE DISCLOSURE

1. Field of the Disclosure

The present disclosure relates to a leakage current monitoring apparatus, and particularly, to a leakage current monitoring apparatus which monitors a resistive component leakage current harmful to a human body in a leakage current in association with a transformer-less photovoltaic (abbreviated as "PV" hereinafter) inverter connected to a grid.

2. Background of the Disclosure

In generating PV electric power, the electric power is generated by using an array of a PV module, and a type of power generated from the array of the PV module is direct current (abbreviated as "DC" hereinafter). Therefore, in order to supply generated electric power to a source of demand such as home or a company, it is required to convert the DC electric power into alternating current (abbreviated as "AC" hereinafter) electric power.

FIG. 1 illustrates an example of a grid-tied PV power generation system 10.

The grid-tied PV power generation system 10 may include PV module 11, an inverter 12, and a grid 13. The PV module 11 generates DC electric power by using sunlight, and the generated electric power is converted into AC electric power through the inverter 12 and is transferred to the grid 13.

Efficiency and stability should be considered when generating electric power with sunlight.

The inverter 12 may be categorized into an inverter, which is electrically insulated by a transformer, and a transformer-less inverter that does not include a transformer. Recently, the transformer-less inverter having advantages in terms of conditions such as efficiency, price, volume, and weight is attracting much attraction. However, a leakage current can severely occur in the transformer-less inverter that does not include the transformer.

In FIG. 1, fault conditions of a PV+ terminal or a PV– terminal of the PV module 11 are illustrated.

When a leakage current occurs, a resistive component R and a capacitive component C may exist between an electrical line and the earth. In this case, a leakage current caused by the capacitive component C is a value which always exists due to a characteristic of the PV module 11, and is not a component harmful to a human body. A leakage current caused by the resistive component R is a harmful component capable of affecting creature such as plants as well as human bodies.

Therefore, it is required to respond to a resistive component leakage current when using the transformer-less inverter.

SUMMARY OF THE DISCLOSURE

Therefore, an aspect of the this disclosure is to provide an apparatus for monitoring a leakage current of a transformer-less PV inverter, which measures a resistive component leakage current from a leakage current sensed from a transformer-less PV inverter, thereby enhancing safety against the risk of injury to a user's body and a fault in a grid which is caused when an inverter operates.

To achieve these and other advantages and in accordance with the purpose of this disclosure, as embodied and broadly described herein, an apparatus for monitoring a leakage current of a transformer-less photovoltaic inverter according to present invention comprising:

a low pass filter configured to remove a high-frequency noise of a sensed leakage current signal;

an average value calculator configured to calculate an average value of an output of the low pass filter;

a direct current component remover configured to subtract the average value from the output of the low pass filter to remove a direct current component;

a phase locked loop circuit section configured to calculate a peak value and a phase of a signal from which the direct current component has been removed; and a resistive component leakage current calculator configured to calculate a resistive component value of a leakage current, based on the peak value and the phase calculated by the phase locked loop circuit section.

When a phase of a grid voltage is θ_grid, the phase calculated by the phase locked loop circuit section is θ_zct, and a peak current value calculated by the phase locked loop circuit section is $I_{peak}$, the resistive component leakage current calculator may calculate a root mean square value of an alternating current (AC) component of the leakage current as expressed in the following Equation:

$$\text{root mean square value} = \frac{\cos(\Delta\theta)SI_{Peak}}{\sqrt{2}}$$

where Δθ is θ_grid−θ_zct a resistive component value of the leakage current may be calculated by adding an absolute value of the average value, calculated by the average value calculator, to the root mean square value.

Moreover, Δθ may be a value obtained by further adding a phase for delay compensation.

A function of each of the low pass filter, the average value calculator, the DC component remover, and the resistive component leakage current calculator may be performed by a microprocessor.

The apparatus may further comprises:

a zero phase current transformer configured to measure a leakage current;

an amplification unit configured to amplify an output signal of the zero phase current transformer; and an analog-to-digital converter configured to convert an analog signal of the amplification unit into a digital signal.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, an apparatus for monitoring a leakage current of a transformer-less PV inverter according to an exemplary embodiment of the present invention will be described in detail with reference to the accompanying drawings.

Figure 1:
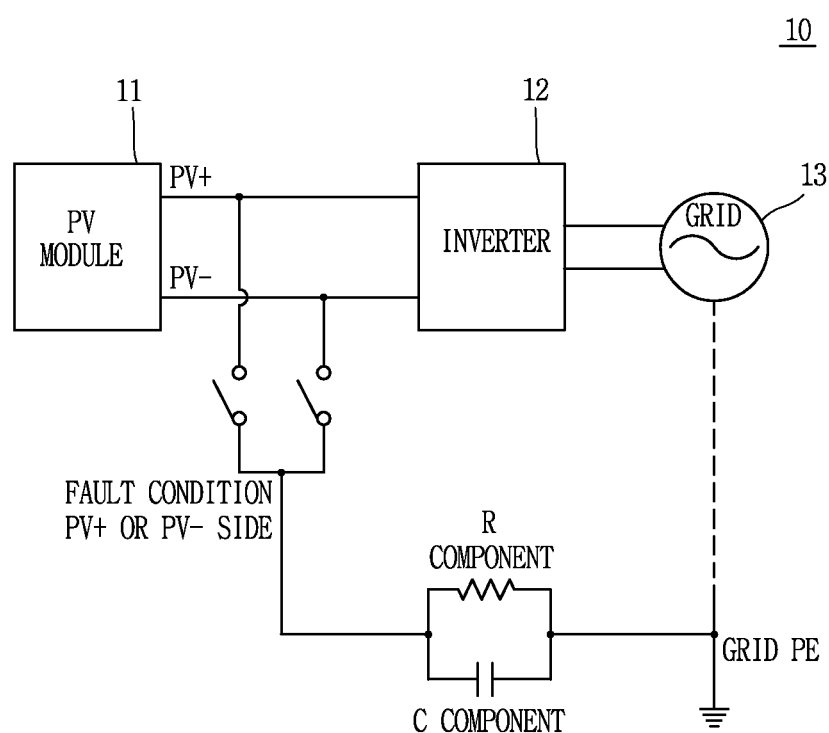
FIG. 1 is a block diagram illustrating a configuration of a grid-tied PV electric power generation system.
Figure 2:
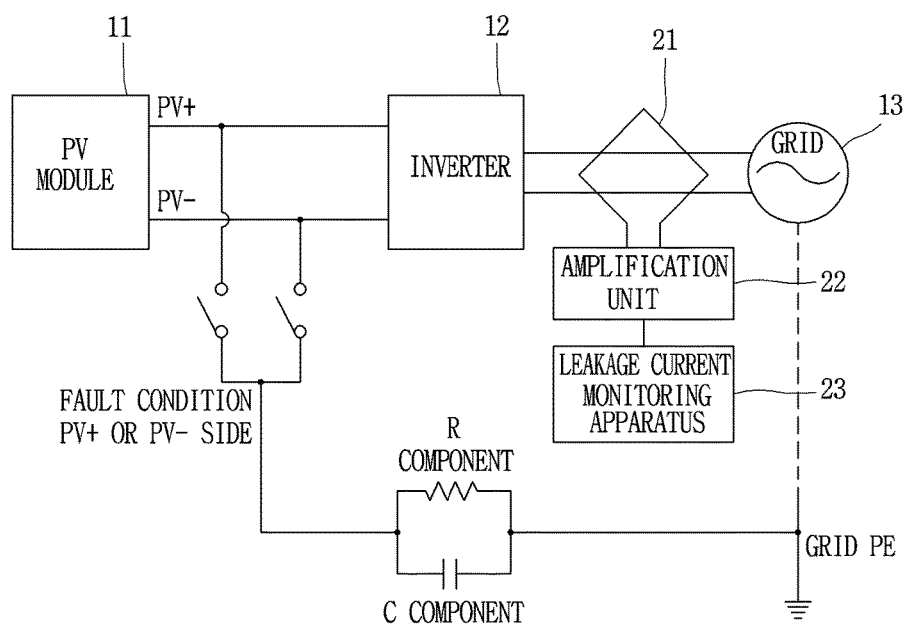
FIG. 2 is a block diagram illustrating a configuration of a grid-tied PV electric power generation system to which a leakage current monitoring apparatus according to an exemplary embodiment of the present invention is applied.

FIG. 2 is a block diagram illustrating an example of a grid-tied PV electric power generation system 20 to which a leakage current monitoring apparatus 23 according to an exemplary embodiment of the present invention is applied. A zero phase current transformer (abbreviated as "ZCT" hereinafter) is disposed on an electric power line through which electric power is supplied from an inverter 12 to a grid 13, and measures a leakage current which flows in the inverter 12.

As a detailed example of the ZCT 21, a hole-type ZCT in which a signal line through which a leakage current flows is wound around a ring-type core where the electric power line passes through the inside thereof may be used. A winding of the electric power line and a winding of a neutral line pass through a hole of the ZCT 21, and a leakage current which flows in each of two the signal lines is measured. In this case, windings of the two signal lines are wound in the same direction, and as a winding is more wound, a leakage current value is amplified.

An actually flowing leakage current may be divided into a capacitive component C of the earth and a resistive component R caused by a fault in a grid. The ZCT 21 may output the measured leakage current as a voltage value within a certain range.

An amplification unit 22 may amplify an output of the ZCT 21. This amplifying is for adjusting an output voltage level of the ZCT 21 to a voltage level capable of being input to the leakage current monitoring apparatus 23.

Figure 3:
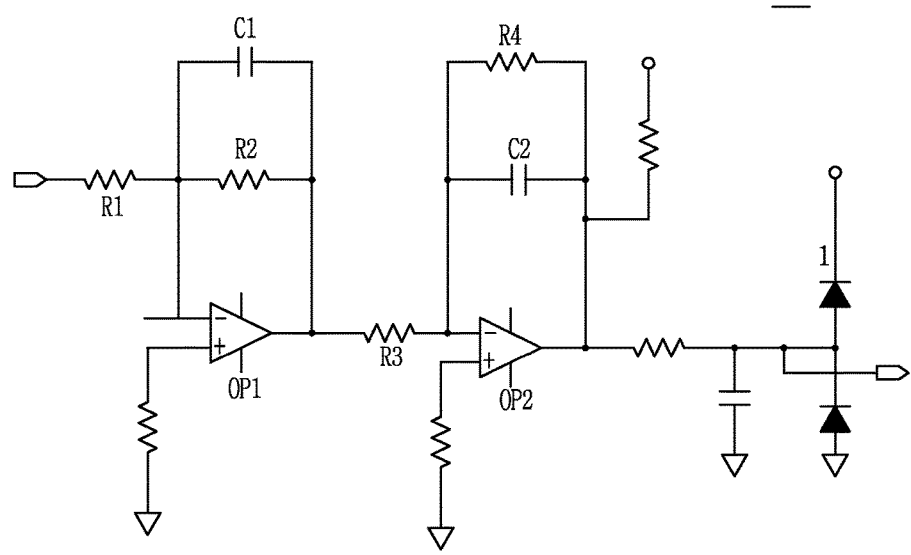
FIG. 3 is a circuit diagram illustrating a configuration of an amplification unit in the leakage current monitoring apparatus according to an exemplary embodiment of the present invention.

The amplification unit 22 may be variously configured depending on the needs. FIG. 3 illustrates an example of the amplification unit 22.

When a voltage signal measured from the ZCT 21 is input, the voltage signal may be amplified at a ratio of −R2/R1 by a first operational amplifier OP1, and may be again amplified at a ratio of −R4/R3 by a second operational amplifier OP2.

In this case, due to a feedback capacitor C1 of the first operational amplifier OP1 and a feedback capacitor C2 of the second operational amplifier OP2, filtering may be performed at a cutoff frequency of $1/2\pi R2C1$ and a cutoff frequency of $1/2\pi R4C2$. That is, the amplification unit 22 may additionally perform a filter function in addition to an amplification function.

The leakage current monitoring apparatus 23 may calculate a resistive component value of a leakage current, based on a signal amplified by the amplification unit 22. The leakage current monitoring apparatus 23 may be configured in order for a microprocessor to perform all or some of elements thereof.

In an exemplary embodiment in which the leakage current monitoring apparatus 23 is configured with the microprocessor, an analog signal amplified by the amplification unit 22 should be converted into a digital signal. To this end, an analog-to-digital (A/D) converter may be provided outside the microprocessor, or may be built into the microprocessor.

As a detailed example, in a case of using the A/D converter of the microprocessor, when it is assumed that an input voltage level of the A/D converter is 3 V and an output voltage level of the ZCT 21 is 5 V, the amplification unit 22 may be configured to have a degree of amplification of ⅔. In this case, for example, respective resistance values of a plurality of resistors R1 to R4 may be 15 KΩ, 10 KΩ, 100 KΩ, and 100 KΩ.

Figure 4:
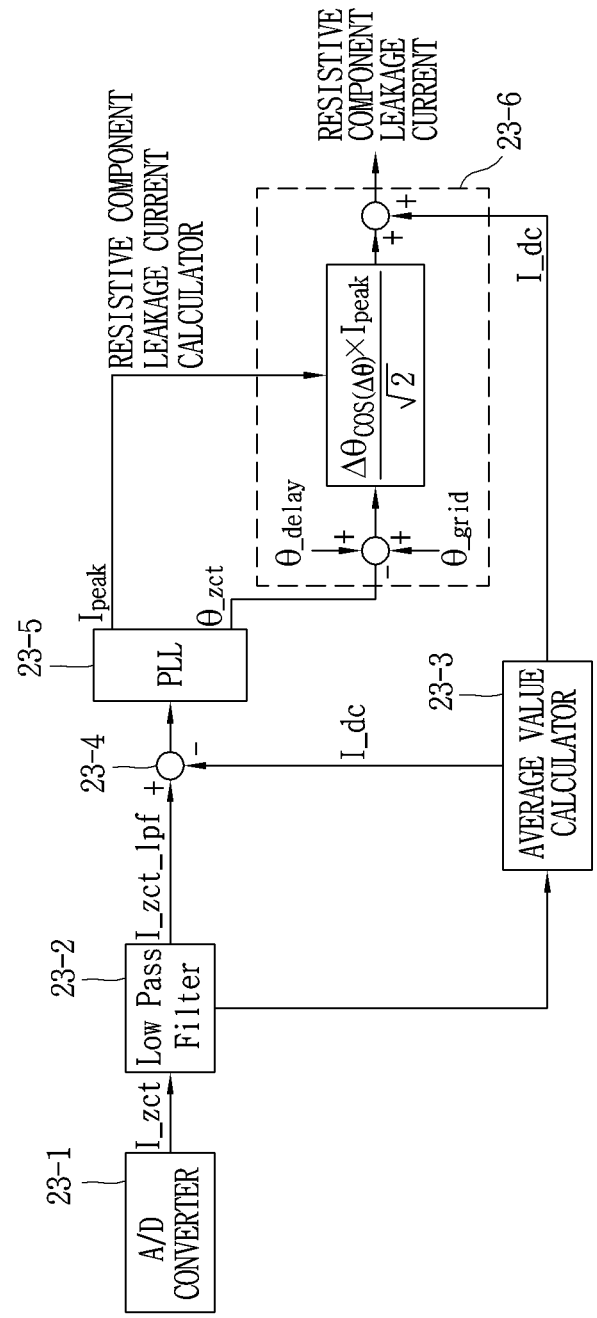
FIG. 4 is a block diagram illustrating a configuration of the leakage current monitoring apparatus according to an exemplary embodiment of the present invention.

Referring to FIG. 4, the leakage current monitoring apparatus 23 comprises a low pass filter 23-2, an average value calculator 23-3, a DC component remover 23-4, a phase locked loop circuit section (abbreviated as "PLL" circuit section hereinafter) 23-5, and a resistive component leakage current calculator 23-6. Also, the leakage current monitoring apparatus 23 may further comprise an A/D converter 23-1 that receives an analog signal amplified by the amplification unit 22 and converts the analog signal into a digital signal to output the digital signal.

The low pass filter 23-2 may remove a high-frequency noise, having a higher frequency than a predetermined cutoff frequency, from an input signal.

For example, when the amplification unit 22 is configured as illustrated in FIG. 3, a signal measured by the ZCT 21 may be filtered twice.

The average value calculator 23-3 may calculate an average value (a DC value) of an output of the low pass filter 23-2. For example, the average value calculator 23-3 may periodically calculate the average value.

The DC component remover 23-4 may subtract the average value, calculated by the average value calculator 23-3, from an output of the low pass filter 23-2 to remove a DC component, thereby allowing only an AC component to remain. The reason that the DC component is removed by the DC component remover 23-4 is for PLL processing.

The PLL circuit section 23-5 may convert an AC signal, from which the DC component has been removed, into a synchronous reference frame to calculate a peak value and a phase of a corresponding signal.

The resistive component leakage current calculator 23-6 may calculate a resistive component value of a leakage current, based on the peak value and the phase calculated by the PLL circuit section 23-5.

First, the resistive component leakage current calculator 23-6 may calculate a root mean square value of an AC component of the leakage current as expressed in the following Equation:

$$\text{root mean square value} = \frac{\cos(\Delta\theta)I_{Peak}}{\sqrt{2}}$$

where when a phase of a grid voltage is θ_grid and a phase calculated by the PLL circuit section 23-5 is θ_zct, Δθ is θ_grid−θ_zct, and $I_{peak}$ is a peak value of an AC component calculated by the PLL circuit section 23-5.

Here, "θ_grid−θ_zct" denotes a phase difference between a resistive component R and a capacitive component C of a leakage current.

The resistive component leakage current calculator 23-6 may add an absolute value of the average value, which is calculated by the average value calculator 23-3, to the root mean square value to calculate a resistive component value of the leakage current. The reason that adds the absolute value of the average value calculated by the average value calculator 23-3 is because a DC component is included in the resistive component leakage current but is removed for processing performed by the PLL circuit section 23-5.

Moreover, when calculating Δθ, the resistive component leakage current calculator 23-6 may calculate Δθ as a value which is obtained by adding a predetermined phase for delay compensation. For example, when the phase for delay compensation is θ_delay, Δθ may be calculated as "θ_grid+θ_delay−θ_zct".

The phase for delay compensation is for compensating for time delay which is caused by software calculation when the PLL circuit section 23-5 is configured with the microprocessor.

The leakage current monitoring apparatus 20 according to an exemplary embodiment of the present invention may be configured as a single body having a common enclosure with the inverter 12. In this case, an additional leakage current measurement apparatus is not needed, and thus, the grid-tied PV electric power generation system 20 can be more conveniently implemented.

Moreover, various measures may be made according to a resistive component value of a leakage current calculated by the leakage current monitoring apparatus 23. For example, when a resistive component leakage current value is greater than a predetermined value, an operation of the inverter 12 may stop.

According to the exemplary embodiments of the present invention, only a resistive component of a leakage current which occurs when a PV inverter operates may be measured.

Therefore, stability against a fault in a grid or the risk of injury to a user's body touching an inverter can be enhanced by stopping an operation of the inverter in a risk state. In particular, when the inverter is configured to perform a corresponding function, an additional leakage current measurement apparatus is not needed, and thus, the leakage current monitoring apparatus can be more conveniently applied.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An apparatus for monitoring leakage current of a transformer-less photovoltaic inverter, the apparatus comprising:
   a zero-phase current transformer (ZCT) located on an electric power line through which electric power is supplied from the transformer-less photovoltaic inverter to a grid, wherein the ZCT measures leakage current, and the ZCT includes at least two signal lines wound in a same direction passing through a ring-type core of the ZCT;
   an amplification unit connected to the ZCT, wherein the amplification unit amplifies an output signal received from the ZCT, and the amplification unit includes at least two operational amplifiers and at least one feedback capacitor; and
   a leakage current monitoring circuit, the leakage current monitoring circuit including
   an analog-to-digital converter, wherein the analog-to-digital converter receives an analog signal output by the amplification unit, and converts the analog signal into a digital signal, and
   a microprocessor, wherein the microprocessor includes a low pass filter, an average value calculator, a direct current component remover, and a resistive component leakage current calculator,
   the low pass filter removes high-frequency noise from the digital signal,
   the average value calculator calculates an average value of an output of the low pass filter,
   the direct current component remover subtracts the calculated average from the output of the low pass filter in order to remove a direct current component creating a removed direct current signal,
   the phase locked loop circuit section calculates a peak value and a phase of the removed direct current signal, and
   the resistive component leakage current calculator calculates a resistive component value of leakage current based on the calculated peak value and the calculated phase,
   wherein the apparatus and the transformer-less photovoltaic inverter are configured as a single body having a common enclosure such that only a single leakage current apparatus is necessary, and
   wherein operation of the transformer-less photovoltaic inverter stops when the calculated resistive component value of the leakage current exceeds a predetermined threshold.

2. The apparatus of claim 1, wherein the resistive component leakage current calculator is further configured to calculate a root mean square value of an alternating current component of the leakage current according to the following equation:

$$\text{root mean square value} = \frac{\cos(\Delta\theta)I_{Peak}}{\sqrt{2}}$$

wherein θ_grid is a phase of a grid voltage,
wherein $I_{peak}$ is a peak current value calculated by the phase locked loop circuit section,
wherein Δθ is calculated as θ_grid−θ_zct,
wherein θ zct is the calculated phase of the removed direct current signal, and
wherein the resistive component value of the leakage current is calculated by adding an absolute value of the calculated average value to the root mean square value.

3. The apparatus of claim 2, wherein Δθ is calculated by further adding a phase for delay compensation.

4. The apparatus of claim 1, wherein a winding of the electric power line and a winding of a neutral line pass through the ZCT.

5. The apparatus of claim 4, wherein the ZCT is further configured to measure leakage current flowing in each of two signal lines.

* * * * *